Figure 1:
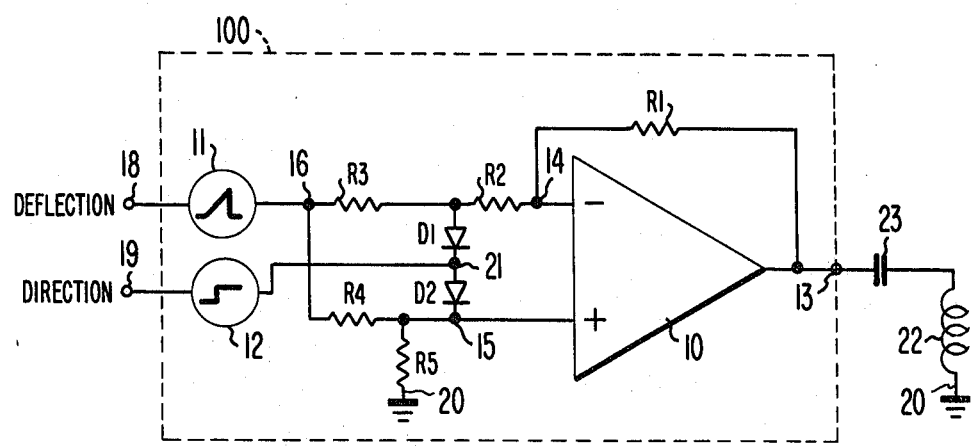

United States Patent [19]
Kelleher

[11] 4,397,014
[45] Aug. 2, 1983

[54] BIDIRECTIONAL PULSE GENERATOR FOR VIDEO DISC STYLUS DEFLECTOR TRANSDUCER

[75] Inventor: Kevin C. Kelleher, Plainfield, Ind.

[73] Assignee: NCR Corporation, Dayton, Ohio

[21] Appl. No.: 290,498

[22] Filed: Aug. 6, 1981

Related U.S. Application Data

[63] Continuation of Ser. No. 98,243, Nov. 28, 1979.

[51] Int. Cl.³ .......................... G11B 17/30; H03K 5/00
[52] U.S. Cl. ...................................... 369/219; 307/262
[58] Field of Search ........................ 307/262; 328/26; 358/342; 369/43, 215, 219, 230, 244

[56] References Cited

U.S. PATENT DOCUMENTS

| | | | |
|---|---|---|---|
| 3,963,861 | 6/1976 | Crooks | 179/100.4DXR |
| 4,068,138 | 1/1978 | Miyakawa et al. | 307/226 |
| 4,064,406 | 12/1977 | Tiemeijer | 307/228 |
| 4,077,015 | 2/1978 | Carson et al. | 331/4 |
| 4,162,511 | 7/1979 | Toda et al. | 360/DIG 1 XR |
| 4,164,756 | 8/1979 | Toda et al. | 360/DIG 1 XR |
| 4,169,276 | 9/1979 | Rodal | 360/DIG 1 XR |
| 4,176,378 | 11/1979 | Toda et al. | 179/100.4DXR |

OTHER PUBLICATIONS

"Trapezoid Generator for CRT", *Guidebook of Electronic Circuits*, Markus, McGraw Hill, 1974, p. 230
"Precision Integrator Resets as it Samples", *Electronics*, Aug. 28, 1972, pp. 78–79
"Simple Control for Sign of Op-Amp Gain", *Electronic Design*, Vol. 23, Nov. 8, 1970

*Primary Examiner*—Aristotelis M. Psitos
*Attorney, Agent, or Firm*—J. T. Cavender; Edward Dugas; Stephen F. Jewett

[57] ABSTRACT

A bidirectional pulse generator suitable for driving a video disc stylus deflector transducer. A differential amplifier is arranged with both its inverting and noninverting input terminals connected for receiving a prescribed pulse waveform. First and second diodes are respectively connected between the inverting and noninverting input terminals and a point of bilevel potential for selectively conditioning one or the other of the diodes to conduct, thereby establishing the quiescent output potential of the amplifier and concurrently shunting the pulsed waveform from one or the other of the amplifier input terminals.

6 Claims, 7 Drawing Figures

BIDIRECTIONAL PULSE GENERATOR FOR VIDEO DISC STYLUS DEFLECTOR TRANSDUCER

This is a continuation of Ser. No. 098,243, filed Nov. 28, 1979.

This invention relates to pulse generators and in particular to a circuit for producing bidirectional pulses. Bidirectional pulse generators of the type described herein have been found useful for driving a video disc stylus deflector transducer.

Certain video disc player systems employ a track following signal pickup stylus for recovering prerecorded information from information-bearing tracks disposed on a record disc. The stylus is secured to a stylus arm which is compliantly mounted in an arm carriage assembly for translating the stylus/stylus arm radially across the disc in synchronism with the rate of advance of the information due to rotation of the disc. A stylus deflector is incorporated with the carriage and stylus arm to correct for anomalous radial stylus movement (inward or outward) or to produce special effects such as stop motion, slow motion, record preview, etc.

A typical deflector transducer comprises a permanent magnet secured to the stylus arm disposed between two electromagnetic coils secured to the carriage assembly. Energizing the coils produces a magnetic field therebetween to induce a relatively precise translation of the permanent magnet and thereby a radial translation of the stylus/stylus arm. See for example U.S. Pat. No. 4,262,174, filed May 15, 1979, by J. C. Bleazey and entitled, "Track Skipper for Video Disc" assigned to the common assignee with this invention.

The present invention is a circuit suitable for producing energizing pulses for the deflector coils capable of providing stylus translations or deflections of varying distance in both the inward and outward radial direction.

A waveform generator responsive to a first control signal generates a signal having a prescribed waveshape, the amplitude of which being proportional to the duration of the first control signal. Signal from the waveform generator is selectively applied to either the inverting or non-inverting input terminal of a differential amplifier depending upon the desired polarity of drive signal. The amplifier input terminal signal selection is controlled by a second control signal whch concurrently establishes the quiescent bias potentials of the amplifier input terminals and thereby the amplifier output quiescent potential. For example, if a negative-going drive pulse is desired the second control signal conditions the amplifier non-inverting input terminal potential bias at a relatively high potential and conditions the inverting input terminal to receive signal from the waveform generator. The amplifier quiescent output potential assumes a relatively high potential responsive to such bias and upon the occurrence of a first control signal pulse the signal applied by the waveform generator to the inverting input terminal is amplified and inverted at the amplifier output. The amplifier output potential goes through a negative excursion from the relatively high quiescent potential tending toward the relatively low supply potential. Conversely, if a positive going output drive signal is desired, the second control signal conditions the bias at the non-inverting input terminal relatively low (and thereby the amplifier output quiescent potential low) and conditions the non-inverting input terminal to receive signal from the waveform generator. In this case the output drive signal excursion is positive going, from the relatively low quiescent output potential toward the relatively high supply potential.

Figure 2:
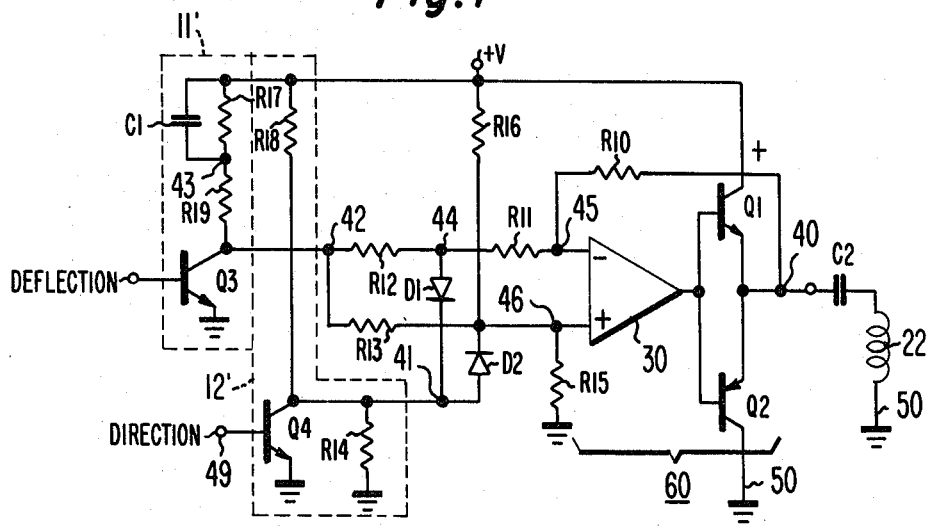
Figure 3:
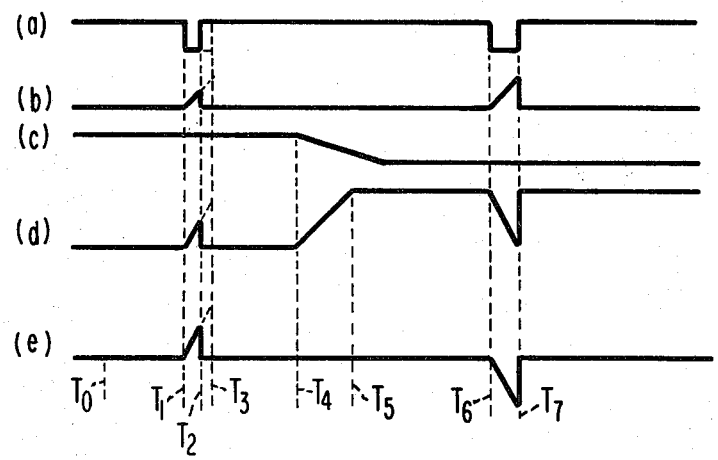

In the drawings:

FIGS. 1 and 2 are circuit schematic diagrams of bidirectional pulse generators embodying the present invention; and FIG. 3, consisting of a-e, is a time versus voltage waveform diagram relating the output potential of the FIG. 2 circuit to the applied control voltages.

In FIG. 1 a transducer 22, e.g., an electromagnetic coil, piezoelectric crystal, etc., is coupled via capacitor 23 to the output connection 13 of the bidirectional pulse generator 100. Capacitor 23 serves the purpose of isolating the DC potential at connection 13 from the transducer 22 so that positive-going signals and negative-going signals with prescribed minimum frequency components are coupled to the transducer having an average DC potential about reference potential 20.

The pulse generator 100 is responsive to two control signals, a deflection pulse applied to terminal 18 and a direction signal applied to terminal 19. In normal operation, transitions of the two control signals do not occur simultaneously but rather the state of the direction signal is established with the pulse generator response thereto completed before the occurrence of a deflection pulse.

In the FIG. 1 circuit a differential amplifier 10 has a non-inverting input connection 15 connected to the output terminal 16 of waveform generator 11 by a resistor R4 and connected to reference potential 20 by resistor R5. An inverting input connection 14 of the differential amplifier 10 is connected to waveform generator 11 by the serially connected resistors R2 and R3 and is connected to the output connection 13 by feedback resistor R1. A first diode D1 connects the intersection of resistors R2 and R3 to the direction signal buffer circuit 12 and a second diode D2 connects the non-inverting input connection 15 of amplifier 10 to circuit 12. The output impedance of both the waveform generator 11 and the direction signal buffer circuit 12 are relatively low compared to the resistances of R3 and R4.

In operation, the direction signal applied to terminal 19 is one of two levels, high or low. These levels are buffered by circuit 12 to produce a signal which is applied to the interconnection 21 of diodes D1 and D2. In the presence of a relatively high potential at connection 21, diode D2 is conditioned to conduct thereby imposing the relatively high potential at connection 21 on the non-inverting input connection 15 (less a forward diode drop). Concurrently diode D1 is reverse biased or cut off effectively eliminating it from the circuit. In the absence of a deflection pulse, terminal 16 is substantially at reference potential, configuring the circuit as a non-inverting amplifier with a relatively high DC potential signal at its input, and exhibiting a DC gain at its output terminal 13 of $(1+R1/(R2+R3))$ producing a relatively high output potential where R1, R2 and R3 are the respective resistance values of the corresponding resistors.

Application of a deflection pulse to terminal 18 conditions the waveform generator 11 to output a positive-going pulse of prescribed amplitude and waveshape to terminal 16, which pulse is coupled by resistors R2 and R3 to the inverting input connection 14 of amplifier 10. The pulse applied to terminal 16 is precluded from modulating the non-inverting input connection 15 by the clamping action of forward-biased diode D2. The amplifier 10 inverts the sense of the pulse applied to its inverting input. The pulse is propagated through the amplifier appearing at the output connection 13 inverted and modified by the gain factor R1/(R2+R3). The output pulse at connection 13 commences at the relative high DC level established by the direction signal and tends toward the opposite or relatively low supply potential.

On the other hand, if a low direction potential is applied to terminal 19, a relatively low potential appears on interconnection 21, which potential is insufficient to condition diode D2 to conduct. The potential at connection 15 is pulled near reference potential, e.g., ground, by the conduction path provided by resistor R5.

The potential offset of the amplifier is arranged so that under these circumstances the output potential, though relatively low, when translated back by the resistors R1 and R2 is sufficient to condition diode D1 to conduct. Now upon the occurrence of a deflection pulse, such pulse is precluded from modulating the inverting input connection 14 by the clamping action of diode D1, but is coupled to the non-inverting input connection 15 by resistor R4. The pulse is propagated to the output non-inverted, and modified by the gain factor (1+R1/R2). The output pulse at connection 13 commences at the relatively low DC potential established by the low direction signal and goes through an excursion tending toward the positive or relatively high supply potential.

In FIG. 2, amplifier 30 driving complementary transistor emitter followers Q1 and Q2, forms a composite differential amplifier 60 with negative feedback provided by resistor R10. The output signal at connection 40 from amplifier 60 is coupled via capacitor C2 to a transducer 22. A direction signal buffer circuit 12', comprising transistor Q4 and resistors R14 and R18 is responsive to a bilevel direction signal applied to terminal 49 to generate a potential for selectively conditioning diodes D1 and D2 to conduct. A low potential signal applied to terminal 49 conditions Q4 to be non-conducting so that the potential at interconnection 41 is determined by the ratio R14/(R14+R18) times the value of the supply potential V. Under these conditions, the potential at interconnection 41 is relatively high where R14 and R18 are the respective resistance values of the corresponding resistors. On the other hand a high signal applied to terminal 49 conditions transistor Q4 to conduct essentially clamping interconnection 41 to ground potential, i.e., a relatively low potential. The dynamic impedance looking into the buffer circuit 12' from interconnection 41 is the saturation resistance of Q4 when conducting, or the impedance of the parallel connection of resistors R18 and R14, i.e. R18·R14/(R18+R14), the latter impedance being substantially smaller than the resistance of resistor R13. As in the circuit of FIG. 1, application of DC potentials to the interconnection of the diodes selectively establishes the DC bias of the amplifier and determines which of the inverting and non-inverting amplifier input terminals receives signal applied by waveform generator 11'.

Waveform generator 11' comprises transistor Q3, resistors R17, R19 and capacitor C1. The resistance of R19 is small compared to the resistance of R17 and is included to improve the fall time at terminal 42 and to limit dissipation in transistor Q3 when it conducts initially to discharge capacitor C1. The potential at input terminal 48 is normally sufficiently high to condition transistor Q3 to be conducting in saturation, thereby grounding terminal 42. The potential at connection 43 discharges through resistor R19 to a value V1 equal to R19/(R17+R19) times V supply. The occurrence of a deflection pulse at terminal 48 turns transistor Q3 off, terminal 42 becomes a relatively high impedance point thereby allowing connection 43 to charge toward V supply through resistor R17 with a time constant $\tau = R17C1$. Such charging produces a fairly linear positive going ramp potential signal for a relatively large portion of the potential excursion from potential V1 to V supply. The potential V43 at connection 43 is approximated by:

$$V43 = V \text{ supply } (1 - \exp(-t/R17C1)) \qquad (1)$$

where R17 and C1 are the respective resistance and capacitance values of the corresponding devices and from which it can be seen that the longer the duration of time t the larger the amplitude of potential V43. The time t corresponds to the duration of the deflection pulse, i.e., the time Q3 is non-conducting.

The potential V43 is coupled via resistor R19 to the terminal 42 from which it is applied to the non-inverting terminal 46 or inverting terminal 45 of amplifier 30 depending on which diode is conducting.

The resistors R16 and R15 form a potential divider to bias connection 46 slightly positive for diode D2 non-conducting. This potential is chosen such that when amplified by amplifier 60 and fed back to connection 44 via resistors R10 and R11 it conditions diode D1 to conduct. Thus for connection 46 at a relatively low potential, diode D1 is forward biased and clamps the input signal to the inverting signal terminal 45 at a DC potential.

Referring to FIG. 3, waveform 3(a) corresponds to the deflection pulse applied to terminal 48, and waveform 3(b) is the potential produced at terminal 42. At time To, transistor Q3 is conducting and terminal 42 is clamped to ground. At time T1 the deflection pulses goes negative turning off transistor Q3 and allowing connection 43 and thereby terminal 42 to charge toward the positive supply potential, the longer the charging time the higher the resulting potential, as demonstrated by the broken lines in the figure. Finally, at time T2 the deflection pulse terminates, transistor Q3 again conducts and terminal 42 is clamped to ground. The potential at terminal 42 is applied to the amplifier non-inverting input terminal 46 with a positive-going signal appearing at output connection 40 (waveform 3(d)) which is coupled by capacitor C2 to transducer 22 (waveform 3(e)).

Waveform 3(c) represents the direction signal applied to terminal 49. At time To the direction signal is high, transistor Q4 conducts and node 41 is low with the consequence of biasing the ouput at connection 40 low. Between times T4 and T5 the direction pulse is going through a transition from high toward low, turning Q4 off, and biasing connection 46 relatively high, etc. From waveform 3(d) it is seen that the subsequent deflection signal at node 42 is inverted (time T6–T7). The transition (T4–T5) of the direction signal is relatively long compared with the signal transition (T6–T7) to prevent the DC potential transition at connection 40 from being coupled in sufficient amplitude by capacitor C2 to energize the transducer 22.

Table 1 is a list of device values for a particular realization of the FIG. 2 circuit.

TABLE 1

| Resistor | Resistance | |
|---|---|---|
| R10 | 100K Ohm | |
| R11 | 15K Ohm | |
| R12 | 51K Ohm | |
| R13 | 330K Ohm | |
| R14 | 10K Ohm | |
| R15 | 110K Ohm | |
| R16 | 1.3M Ohm | |
| R17 | 15K Ohm | |
| R18 | 12K Ohm | |
| R19 | 1K Ohm | |
| Capacitor | Capacitance | |
| C1 | 0.1µ Farad | |
| Diode D1, D2 | IN914 | |
| Transistors Q3, Q4 | MPSA17 | Motorola transistors |
| Transistor Q1 | MPSU01 | |
| Transistor Q2 | MPSU51 | |
| Amplifier 30 | CA324 | |

What is claimed is:

1. A bidirectional pulse generator for driving a video disc stylus transducer, said pulse generator energized by a supply potential and being capable of producing positive going and negative going drive pulses with respective amplitudes substantially equal to said supply potential comprising:

respective terminals for applying first and second control signals;

an output terminal;

a waveform generator having an output connection, said generator being responsive to said first control signal for generating an output signal having an amplitude proportional to the duration of said control signal;

an amplifier having a signal input terminal connected for receiving said output signal and having an output connection;

circuit means responsive to said second control signal for selectively establishing the operating mode of the amplifier between one of an inverting and non-inverting mode and for selectively establishing a quiescent potential at the output connection of said amplifier at one of a relatively high and a relatively low potential, said relatively high and low potentials tending toward the relatively positive and negative potential of said supply potential; and a capacitor connected between said amplifier output connection and said output terminal.

2. The bidirectional pulse generator set forth in claim 1 wherein the waveform generator comprises:

a further capacitor having a first plate connected to reference potential and having a second plate;

means for charging the second plate of said further capacitor to a prescribed potential; and means responsive to said first control signal for selectively discharging said second capacitor plate and clamping the potential thereat at a prescribed amplitude.

3. The bidirectional pulse generator set forth in claim 1 wherein the amplifier comprises:

a differential amplifier having an inverting and a non-inverting signal input terminal and an output terminal; and respective means connecting the differential amplifier inverting input terminal and non-inverting input terminal to the output terminal of the waveform generator.

4. The bidirectional pulse generator set forth in claim 3 wherein the circuit means comprises:

means responsive to said second control signal for generating at an output connection thereof a bistate bias signal of relatively high or relatively low bias potential;

means including first and second unidirectional conduction devices having respective first and second ends, said first and second unidirectional conduction devices interconnected in serial arrangement so that both devices in said serial arrangement are poled to conduct in the same direction and wherein respective ends of said serial arrangement are connected to said amplifier inverting and non-inverting input terminals;

means for connecting the output connection of the bistate bias signal generating means to the interconnection of the first and second unidirectional conduction devices, said bistate bias signal alternatively biasing said first and second unidirectional conduction devices into conduction.

5. The bidirectional pulse generator set forth in claim 3 wherein said circuit means comprises:

means for diverting the waveform generator signal from the amplifier non-inverting input terminal concurrent with the non-inverting input terminal being biased at said relatively high potential and for diverting the waveform generator signal from the inverting input terminal concurrent with the non-inverting input terminal being biased at said relatively low potential.

6. Circuitry for energizing a video disc stylus deflector comprising:

a waveform generator responsive to a first control signal for generating an output signal of prescribed amplitude, said generator having an output terminal;

amplifier means having inverting and non-inverting input terminals and an output terminal;

a first resistor connected between the waveform generator output terminal and the amplifier non-inverting input terminal;

a second resistor connected between the amplifier non-inverting input terminal and a point of relatively low reference potential;

third and fourth resistors having respective first ends connected to the waveform generator output terminal and the amplifier inverting input terminal respectively, and having respective second ends connected to a first node;

a fifth resistor connected between the amplifier inverting input and output terminals, said fifth and fourth resistors determining the non-inverting gain factor of the amplifier and said fifth, fourth and third resistors establishing the inverting gain factor of the amplifier;

a first unidirectional conduction device having a first end connected to said first node and having a second end connected to a second node;

a second unidirectional conduction device having a first end connected to said second node and a second end connected to the amplifier non-inverting input terminal;

means for selectively applying first and second potentials to said second node whereby one of said first and second unidirectional conduction devices is conditioned to conduct in the presence of one of said first and second potentials and the other of said first and second unidirectional conduction devices is conditioned to conduct upon application of the other of said first and second potentials; and means connecting the amplifier output terminal for energizing said stylus deflector.

* * * * *

UNITED STATES PATENT AND TRADEMARK OFFICE
CERTIFICATE OF CORRECTION

PATENT NO. : 4,397,014
DATED : Aug. 2, 1983
INVENTOR(S) : Kelleher, Kevin C.

It is certified that error appears in the above-identified patent and that said Letters Patent is hereby corrected as shown below:

Title page:

[73] Assignee, that portion reading "NCR Corporation, Dayton, Ohio" should read --RCA Corporation, New York, N.Y.--.

Attorney, Agent, or Firm, that portion reading "J.T. Cavender; Edward Dugas; Stephen F. Jewett" should read --Eugene M. Whitacre; Joseph S. Tripoli; Eric P. Herrmann--.

Signed and Sealed this

Twenty-ninth Day of May 1984

[SEAL]

Attest:

GERALD J. MOSSINGHOFF

Attesting Officer

Commissioner of Patents and Trademarks